(12) United States Patent
Kusabe

(10) Patent No.: US 7,009,276 B2
(45) Date of Patent: Mar. 7, 2006

(54) THIN FILM CAPACITOR, THIN FILM CAPACITOR ARRAY AND ELECTRONIC COMPONENT

(75) Inventor: Kazuhiro Kusabe, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/950,360

(22) Filed: Sep. 24, 2004

(65) Prior Publication Data
US 2005/0088799 A1 Apr. 28, 2005

(30) Foreign Application Priority Data
Sep. 26, 2003 (JP) ............................. 2003-336272
Dec. 22, 2003 (JP) ............................. 2003-425770

(51) Int. Cl.
*H01L 29/41* (2006.01)
(52) U.S. Cl. ...................... 257/532; 257/533; 257/595; 365/149
(58) Field of Classification Search ................ 257/532, 257/533, 595; 365/149
See application file for complete search history.

(56) References Cited

U.S. PATENT DOCUMENTS

| | | | |
|---|---|---|---|
| 4,870,541 A | * | 9/1989 | Cole ........................ 361/328 |
| 5,472,935 A | | 12/1995 | Yandrofski et al. |
| 5,589,845 A | | 12/1996 | Yandrofski et al. |
| 5,694,134 A | | 12/1997 | Barnes |
| 5,721,194 A | | 2/1998 | Yandrofski et al. |
| 5,892,266 A | * | 4/1999 | Hirota et al. ............... 257/532 |
| 2004/0164819 A1 | * | 8/2004 | Mishima et al. ............ 333/174 |

FOREIGN PATENT DOCUMENTS

| | | |
|---|---|---|
| JP | 08-509103 | 9/1996 |
| JP | 11-260667 | 9/1999 |

* cited by examiner

*Primary Examiner*—Connie C. Yoha
(74) *Attorney, Agent, or Firm*—Hogan & Hartson, LLP

(57) ABSTRACT

A thin film capacitor with small electrode resistance and great Q-value which comprises a small number of thin films that are deposited successively is disclosed. It is effective for miniaturization and high density packaging of a device and for preventing poor characteristics and degradation of reliability. A plurality of lower electrodes 2 are provided on a supporting substrate 1, which are spaced apart from each other in a high frequency signal propagation direction P. Two upper electrodes 5 spaced apart from each other in the high frequency signal propagation direction P are provided on one of the plurality of lower electrodes 2 through a thin film dielectric layer 4, by which two capacitance elements are formed. The upper electrodes 5 are connected together by an extraction electrode 8 so that the two capacitance elements are connected in series. A maximum distance L1 between the two upper electrodes 5 in the high frequency signal propagation direction P is smaller than a minimum length W1 of the upper electrodes 5 in the direction perpendicular to the high frequency signal propagation direction P in plan view.

21 Claims, 11 Drawing Sheets

THIN FILM CAPACITOR, THIN FILM CAPACITOR ARRAY AND ELECTRONIC COMPONENT

BACKGROUND OF THE INVENTION

1. Field of the Invention

The present invention relates to a thin film capacitor, capacitor array comprising a plurality of the thin film capacitors connected in parallel to one another, and an electronic component using these. The electronic component is represented particularly by voltage controlled high frequency resonator, voltage controlled high frequency filter, voltage controlled matching circuit chip, voltage controlled antenna duplexer and the like with excellent power handling capability.

2. Description of Related Art

There is a conventionally known thin film capacitor comprising a supporting substrate with electrical insulation, a thin film lower electrode, a thin film dielectric layer and a thin film upper electrode layer successively stacked in this order. In such a thin film capacitor, the lower electrode layer and upper electrode layer are deposited by sputtering, vacuum deposition or the like, and the thin film dielectric layer is deposited by sputtering, the sol-gel process or the like. In addition, a photolithography process as described below is usually used.

First, a conductor layer serving as the lower electrode layer is formed all over the insulative supporting substrate, and then only necessary portions are masked with a photoresist. Thereafter, unnecessary portions are removed by wet or dry etching, and the lower electrode layer is patterned into a predetermined shape. Subsequently, a thin film dielectric layer is deposited all over the supporting substrate, and then, in the same way as the lower electrode layer, unnecessary portions are removed and the thin film dielectric layer is patterned into a predetermined shape. Lastly, a conductor layer serving as the upper electrode layer is deposited all over the surface, and unnecessary portions are removed to form the upper electrode layer into a predetermined shape. In addition, a protective layer and solder terminal portions are formed, which enables surface mounting.

There is also known the so-called variable-capacitance thin film capacitor which employs $(Ba_xSr_{1-x})_yTi_{1-y}O_{3-z}$ as the material for the thin film dielectric layer, in which a predetermined bias potential is applied between the upper and lower electrode layers so as to vary the dielectric constant of the thin film dielectric layer, thereby varying the capacitance of the thin film capacitor.

In the variable-capacitance thin film capacitor, the dielectric constant is varied by application of DC bias voltage, and as a result, the capacitance is varied. Change in capacitance also occurs in a high frequency range, so that it can be used as a variable-capacitance thin film capacitor at a high frequency range. By utilizing such capacitance change of the variable-capacitance thin film capacitors at a high frequency range, useful electronic components whose frequency characteristics can be varied by application of DC bias voltage can be produced. For example, in a voltage controlled thin film resonator that combines the variable-capacitance thin film capacitor and a thin film inductor, resonant frequency can be varied by application of DC bias voltage. In a voltage controlled thin film bandpass filter combining the variable-capacitance thin film capacitor or a voltage controlled thin film resonator with a thin film inductor and a thin film capacitor, the bandpass range can be varied by application of DC bias voltage. In addition, variable-capacitance thin film capacitor can be utilized for voltage controlled electronic components for microwaves.

When a thin film capacitor is used as an electronic component, suppressing insertion loss in the high frequency circuit is required. In order to design a high frequency circuit with small insertion loss, a thin film capacitor with high Q-value is required. Q-value of a capacitor can be expressed by the following equation (a).

$$Q=1/(2\pi fRC+\tan \delta) \qquad (a)$$

Here, f represents frequency (Hz), R represents electrode resistance (Ω), C represents capacitance value (F), and tanδ represents dielectric loss of the dielectric. The dielectric loss tan δ is a material constant determined depending on the material for the dielectric, and frequency f (Hz) and capacitance value C(F) are determined by the values designed for the high frequency circuit. Therefore, from equation (a), it is found that when the electrode resistance R becomes high, the Q-value of the thin film capacitor decreases.

In addition, in order to use the thin film capacitor as an electronic component, miniaturization of the component is required at the same time.

Meanwhile, in the manufacture of thin film capacitors, generally, layers having other functions such as a protective layer and a solder diffusion barrier layer are successively stacked in addition to the lower electrode layer, thin film dielectric layer and the upper electrode layer. However, as the number of layers increases, besides problems such as misalignment in the photolithography process and damage to the lower layers during etching, stress is enhanced by the increase in number of the layers, resulting in cracking in the films, which leads to poor characteristics and degraded reliability.

Furthermore, when the capacitance value C is increased by expanding the area in plan view of the thin film dielectric layer without changing the shapes of the lower electrode layer and upper electrode layer, the electrode resistance R does not decrease despite the increase of the capacitance value C. Therefore, from equation (a), Q-value of the thin film capacitor decreases.

It is an object of the present invention to provide a thin film capacitor with small electrode resistance and great Q-value which is compactly designed so as to be applicable to electronic components, and has a decreased number of thin layers that are successively deposited so as to be effective for miniaturization and high-density packaging of the device, and prevents poor characteristics and degradation of reliability.

It is another object of the present invention to provide a variable-capacitance thin film capacitor whose capacitance can be changed by application of bias voltage, which has small electrode resistance and great Q-value and is compactly designed so as to be applicable to electronic components as described above.

It is still another object of the present invention to provide an electronic component using the thin film capacitor such as voltage controlled high frequency thin film resonator, voltage controlled high frequency thin film filter, voltage controlled matching circuit chip, and voltage controlled thin film antenna duplexer which cause little intermodulation distortion and have excellent power handling capability and good temperature characteristics with use of the foregoing thin film capacitor.

SUMMARY OF THE INVENTION

A thin film capacitor according to the present invention is a capacitor having a plurality of capacitance elements connected between an input terminal and output terminal. The thin film capacitor according to the present invention comprises a supporting substrate, a plurality of lower electrodes spaced apart from each other provided on the supporting substrate, upper electrode formed on the lower electrodes through a thin film dielectric, and an extraction electrode for connecting the upper electrode. The thin film capacitor according to the present invention has at least one of the following features:

(1) a distance L1 between the two upper electrodes formed on each of the lower electrode along a high frequency signal propagation direction is smaller than a length W1 along the direction perpendicular to the high frequency signal propagation direction at an area where the upper electrodes and the extraction electrode overlap in plan view.

(2) a distance L2 between the upper electrodes formed on a couple of the lower electrodes adjacent to each other along a high frequency signal propagation direction is smaller than a length W2 along the direction perpendicular to the high frequency signal propagation direction at an area where the upper electrodes and the extraction electrode overlap in plan view.

(3) a distance L3 of one of the upper electrode formed on the lower electrode along a high frequency signal propagation direction is smaller than a length W3 along the direction perpendicular to the high frequency signal propagation direction at an area where the upper electrodes and the extraction electrode overlap in plan view. By employing any of the aforementioned constructions (1)–(3), in comparison to thin film capacitors with the same number of capacitance elements that do not employ any of the constructions (1)–(3), the distance between the input terminal and output terminal can be shortened, so that a miniaturized thin film capacitor that enables high density packaging can be produced. In addition, since the resistance of the electrodes connecting the capacitance elements to each other can be reduced, insertion loss of the thin film capacitor can be reduced, so that the Q-value thereof can be increased.

Referring particularly to the construction (1), given the thickness of the lower electrode that serves as a propagation path of high frequency signals represented by t1, resistance of the lower electrode in the high frequency signal propagation direction is expressed as the following equation:

$$R = \rho 1 \cdot L1/(W1 \cdot t1) \quad (a)$$

where $\rho 1$ is resistivity ($\Omega \cdot m$) of the lower electrode, and t1 is thickness(m) of the lower electrode.

Here, putting $\alpha = W1/L1$ modifies the equation (a) as $R = \alpha \rho 1/t1$. The smaller a is, the smaller electrical resistance R is. Accordingly, by satisfying W1<L1, a thin film capacitor with minimum resistance loss and great Q-value can be provided.

Referring particularly to the construction (2), given the thickness of the extraction electrode that serves as a propagation path of high frequency signals represented by t2, resistance of the extraction electrode in the high frequency signal propagation direction is expressed as the following equation:

$$R = \rho 2 \cdot L2/(W2 \cdot t2) \quad (b)$$

where $\rho 2$ is resistivity ($\Omega \cdot m$) of the extraction electrode, and t2 is thickness(m) of the extraction electrode.

Here, putting $\beta = W2/L2$ modifies the equation (b) as $R = \beta \rho 2/t2$. The smaller $\beta$ is, the smaller electrical resistance R is. Accordingly, by satisfying W2<L2, a thin film capacitor with minimum resistance loss and great Q-value can be provided.

Referring particularly to the construction (3), a distance L3 between an edge on the input side of one of the upper electrodes and an edge on the output side thereof is smaller than a minimum length W3 in the direction perpendicular to the high frequency signal propagation direction in plan view. This allows the distance between the input terminal and output terminal to be shortened, enabling the size of the thin film capacitor to be reduced.

The above mentioned thin film capacitor may also be a variable-capacitance thin film capacitor whose capacitance varies by application of a DC bias voltage between the input terminal and output terminal by using a thin film dielectric whose dielectric constant varies depending upon the voltage applied thereto. In this case, the capacitance of each of the capacitance elements can be varied by application of DC bias voltage. Also, in this case, the input terminal can serve both as the input terminal for high frequency signals and as the supply terminal for DC bias. As a result, the construction of the device can be simplified.

The variable-capacitance thin film capacitor as described above can be realized by the arrangement in which an input terminal side bias line is connected between the input terminal and a connection point between the nth capacitance element and the (n+1)th capacitance element where n is an even number counted from the input terminal side, and an output terminal side bias line is connected between the output terminal and a connection point between the nth capacitance element and the (n+1)th capacitance element where n is an even number counted from the output terminal side.

The aforementioned bias lines may be provided with thin film resistors.

The bias lines are preferably covered with a protective film comprising at least one kind selected from silicon nitride and silicon oxide. This can prevent the bias lines and/or thin film resistors from being oxidized, so that the resistance of the bias lines can be maintained to be constant over time, by which reliability is improved. Furthermore, moisture resistance can be ensured.

A thin film capacitor array according to the present comprises a plurality of rows of the thin film capacitors connected in parallel between the input terminal and output terminal. This allows a thin film capacitor array with a great capacitance and a Q-value as great as that of the thin film capacitor to be provided by a simple manufacture process (only required is to arrange the number of the capacitors satisfying the desired capacitance in parallel and then cut them).

A capacitor array according to the present invention may have a construction in which the lower electrodes are shared among the plurality of rows of thin film capacitors. This enables further miniaturization and allows a thin film capacitor array having a great capacitance to be provided.

In a capacitor with a shape in which the length of the capacitance generating sections is elongated in the direction perpendicular to the high frequency signal propagation direction, concentration of electric current between two adjacent capacitance generating sections in any of the lower electrodes and extraction electrodes cannot be suppressed, and as a result, the electrode resistance tends to increase and the Q-value tends to decrease. By arranging the upper electrodes to be spaced apart to each other at predetermined intervals in the direction perpendicular to the high frequency signal propagation direction, advantageously, it is possible to mitigate the concentration of electric current and reduce the electrode resistance and maintain a Q-value as great as that in the case of the capacitor before being parallel-connected.

In addition, as a part of the current path passing through the two adjacent capacitance generating sections adjacent to each other in the high frequency signal propagation direction at any of the lower electrodes and extraction electrode, there is a path passing through the end portions of the lower electrodes and extraction electrode. By shortening the distance in the direction perpendicular to the high frequency signal propagation direction between an end portion of the lower electrode and an end portion of the upper electrode closest thereto, this current path can be shortened and the electrode resistance can be reduced.

As a result, it is possible to maintain a Q-value as great as that in the case of the capacitor before being parallel-connected.

An electronic component according to the present invention comprises a resonant circuit that utilizes the aforementioned capacitor as a resonance element. By this arrangement, it is possible to obtain a desired capacitance value with a small number of parts, reduce loss and have a great Q-value. As a result, an electronic component with excellent resonance characteristics and filter characteristics can be provided.

Furthermore, by using the variable-capacitance thin film capacitor, the capacitance can be controlled by voltage, enabling modulation of resonant frequency. More specifically, by employing a variable-capacitance thin film capacitor or a variable-capacitance thin film capacitor array that is series-connected for high frequency and parallel-connected for DC, an electronic component as a voltage controlled high frequency resonator with high power handling capability and minimal wave distortion and intermodulation distortion can be produced. The same applies to a voltage controlled high frequency filter and a voltage controlled antenna duplexer. By employing a variable-capacitance thin film capacitor or a variable-capacitance thin film capacitor array whose capacitance elements are series-connected for high frequency and parallel-connected for DC, a voltage controlled high frequency filter and a voltage controlled antenna duplexer with high power handling capability, minimal wave distortion and intermodulation distortion can be produced.

In addition, an electronic component according to the present invention comprises the thin film capacitor, which utilizes the thin film capacitor as an element coupling a plurality of circuits. By this arrangement, the desired capacitance can be obtained with a small number of parts. In particular, it is possible to produce a resonator using a variable-capacitance thin film capacitor or a variable-capacitance thin film capacitor array which is series-connected for high frequency and parallel-connected for DC, so that Q-value of the resonant circuit can be increased and loss can be minimized.

In any of the constructions described above, it is preferable that the thin film dielectric be formed using $(Ba_x, Sr_{1-x})_y Ti_{1-y} O_{3-z}$. This makes it possible to produce a variable-capacitance capacitor having variable-capacitance elements with large capacitance change and minimal loss. Here, $0<x<1$, $0<y<1$, and z is slightly greater than 0 and considerably less than 1.

DESCRIPTION OF THE PREFERRED EMBODIMENTS

Specific embodiments of the present invention will be described in detail with reference to the appended drawings.

While a variable-capacitance type thin film capacitor with seven variable-capacitance elements is described in the embodiments of the present invention, the number of the variable-capacitance capacitance elements is not limited to seven but may be any number so long as it is plural.

Figure 1:
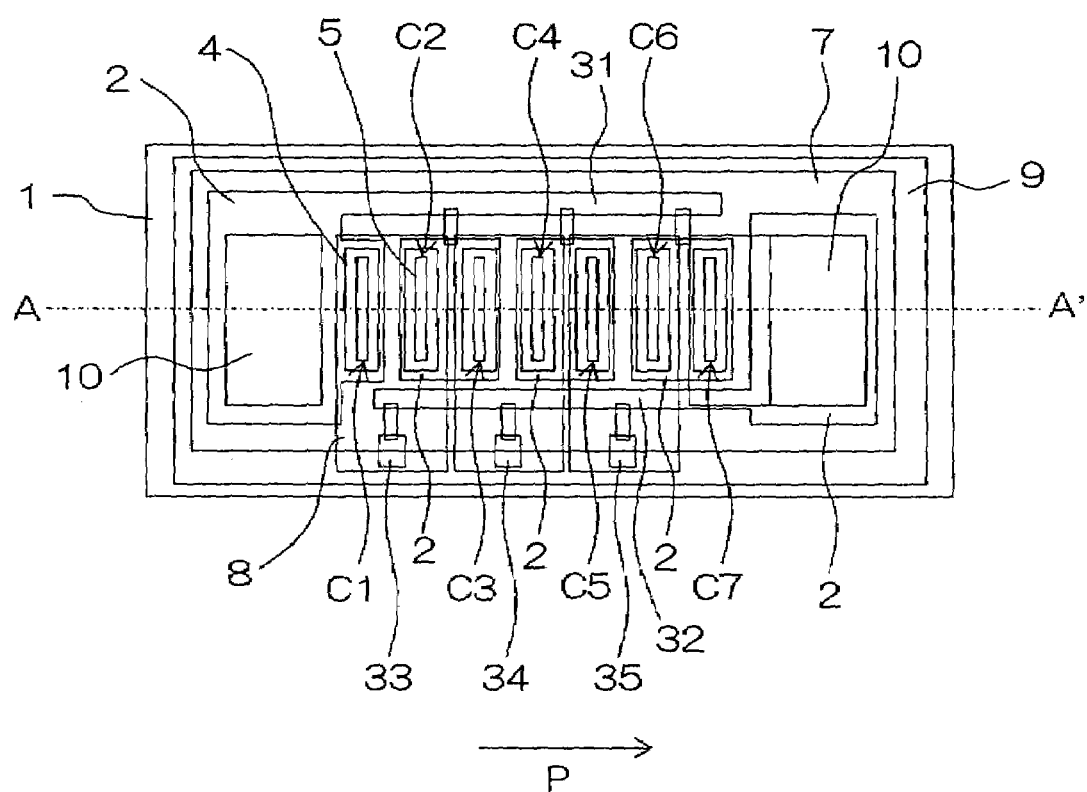
FIG. 1 is a perspective plan view showing one embodiment of a thin film capacitor according to the present invention.
Figure 2:
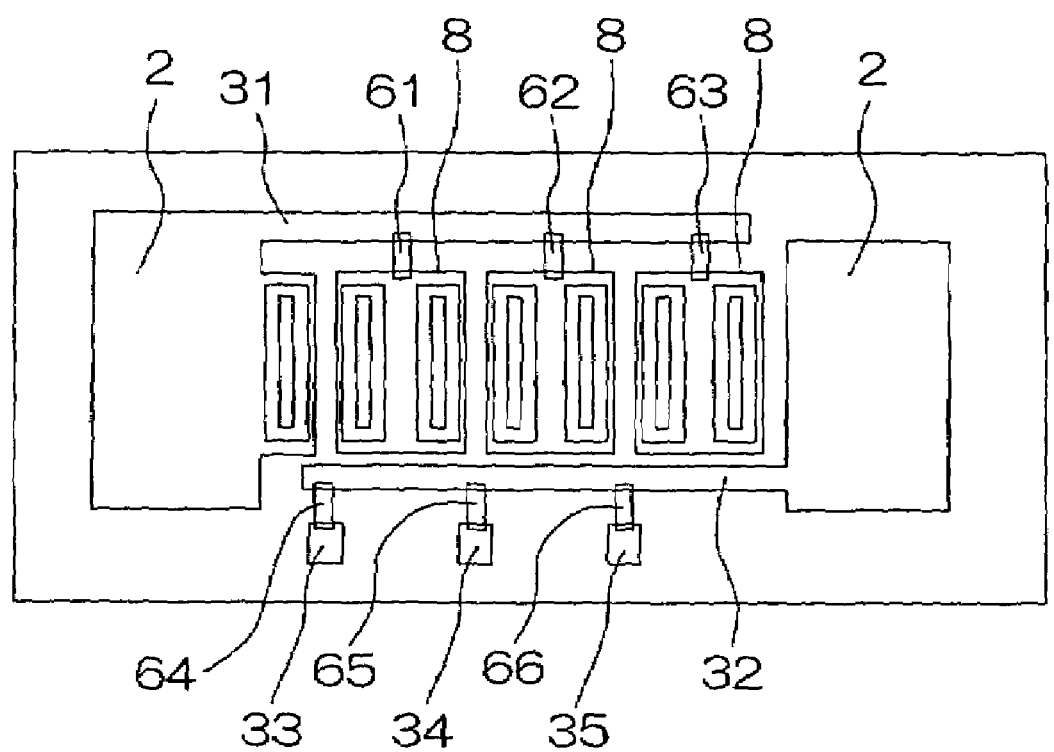
FIG. 2 is a plan view illustrating a connection state of bias lines of a thin film capacitor according to the present invention.
Figure 3:
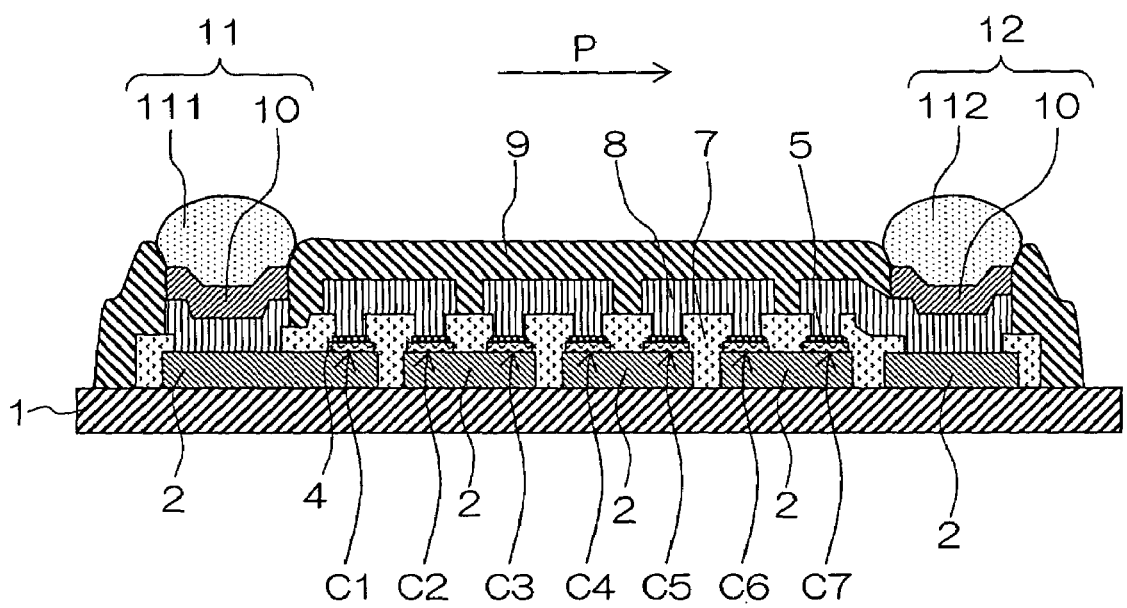
FIG. 3 is a cross-sectional view taken from line A—A' of FIG. 1.

In FIGS. 1–3, a supporting substrate of a thin film capacitor is denoted by 1, and lower electrodes 2 are juxtaposed at predetermined intervals in the high frequency signal propagation direction P (the direction in which high frequency signals propagate from input terminal 11 to output terminal 12). The numerals 31, 32 denote an input terminal bias line and an output terminal bias line, respectively. The numerals 33, 34, denote additional conductor lines. Thin film dielectrics 4 are formed on the lower electrodes 2. Upper electrodes 5 are formed on the thin film dielectrics 4. The numerals 61, 62, 63 denote thin film resistors each connected to the input bias line 31. The numerals 64, 65, 66 denote thin film resistors each connected to the output bias line 32. The numeral 7 denotes an insulation layer that is provided between the lower electrodes 2 adjacent to one another, between the thin film dielectrics 4 adjacent to one another, and between the upper electrodes 5 adjacent to one another in the high frequency signal propagation direction P. Extraction electrodes 8 are provided for series-connecting variable-capacitance elements C1–C7 to one another each comprising the lower electrode 2, thin film dielectric 4 and upper electrode 5. The numeral 9 denotes a protective layer that covers an area except a part of the supporting substrate 1 and the input/output terminals 11, 12. The numeral 10 denotes solder diffusion barrier layers, and the numerals 111 and 112 denote solder terminal portions, respectively. The solder terminal 11 and solder diffusion barrier layer 10 are collectively referred to as "input terminal 11", and the solder terminal 12 and solder diffusion barrier layer 10 are collectively referred to as "output terminal 12".

In FIG. 1, C1–C7 each represent a variable-capacitance element whose capacitance changes depending on the DC bias voltage applied thereto.

Hereinafter, the orders of the thin film dielectrics 4, upper electrodes 5 and variable-capacitance elements C1–C7 aligned in the high frequency signal propagation direction P will be occasionally represented by "j" (j=1, 2, . . . , 7).

The supporting substrate 1 may be a ceramic substrate comprising alumina or the like, or a monocrystal substrate such as sapphire or the like. Layers for forming the lower electrode layer 2, thin film dielectric layer 4 and upper electrode layer 5 are successively deposited over the entire surface of the supporting substrate 1. Thereafter, the upper electrode layer 5 is coated with photoresist to be patterned into a predetermined shape and then etched by dry etching. After this process, the resist is removed. Subsequently, the thin film dielectric layer 4 is coated with photoresist and similarly subjected to a patterning process. Also, the lower electrode layer 2 is subjected to a patterning process. As described above, by forming the upper electrode layer 5, thin film dielectric 4 and lower electrode layer 2 into predetermined shapes by etching, the variable-capacitance elements C1–C7 are formed.

Since sputtering at a high temperature is required for the deposition of the thin film dielectric layer 4, the lower electrode layer 2 needs to be made of a material with a high melting point, namely, Pt, Pd or the like may be used. After the sputtering of the lower electrode layer 2 is finished, the lower electrode layer 2 is heated to a temperature for the sputtering of the thin film dielectric layer 4, which is 700–900° C., and then held for a set period of time until the start of the sputtering of the thin film dielectric 4. The lower electrode layer 2 thus becomes a flattened thin film. The thickness of the lower electrode layer 2 is preferably large in order to lower the resistance of the variable-capacitance elements C1–C7 and wires and prevent the lower electrode layer 2 from suffering discontinuous cracks. However, in order to improve adhesion to the supporting substrate 1, it is preferably relatively thin. Taking the both into consideration, the thickness is determined. Specifically, the thickness of the lower electrode layer 2 is preferably 0.1–10 μm. This is because when the thickness is smaller than 0.1 μm, not only the resistance of the electrodes themselves becomes great, but also the electrodes may fail to keep the continuity. On the other hand, when the thickness is greater than 10 μm, the adhesion to the supporting substrate 1 is lowered, and warpage due to stress from the thickened lower electrodes 2 may occur in the supporting substrate 1.

Now, the configurations viewed from top of the lower electrodes 2 and upper electrodes 5 are described.

Figure 4:
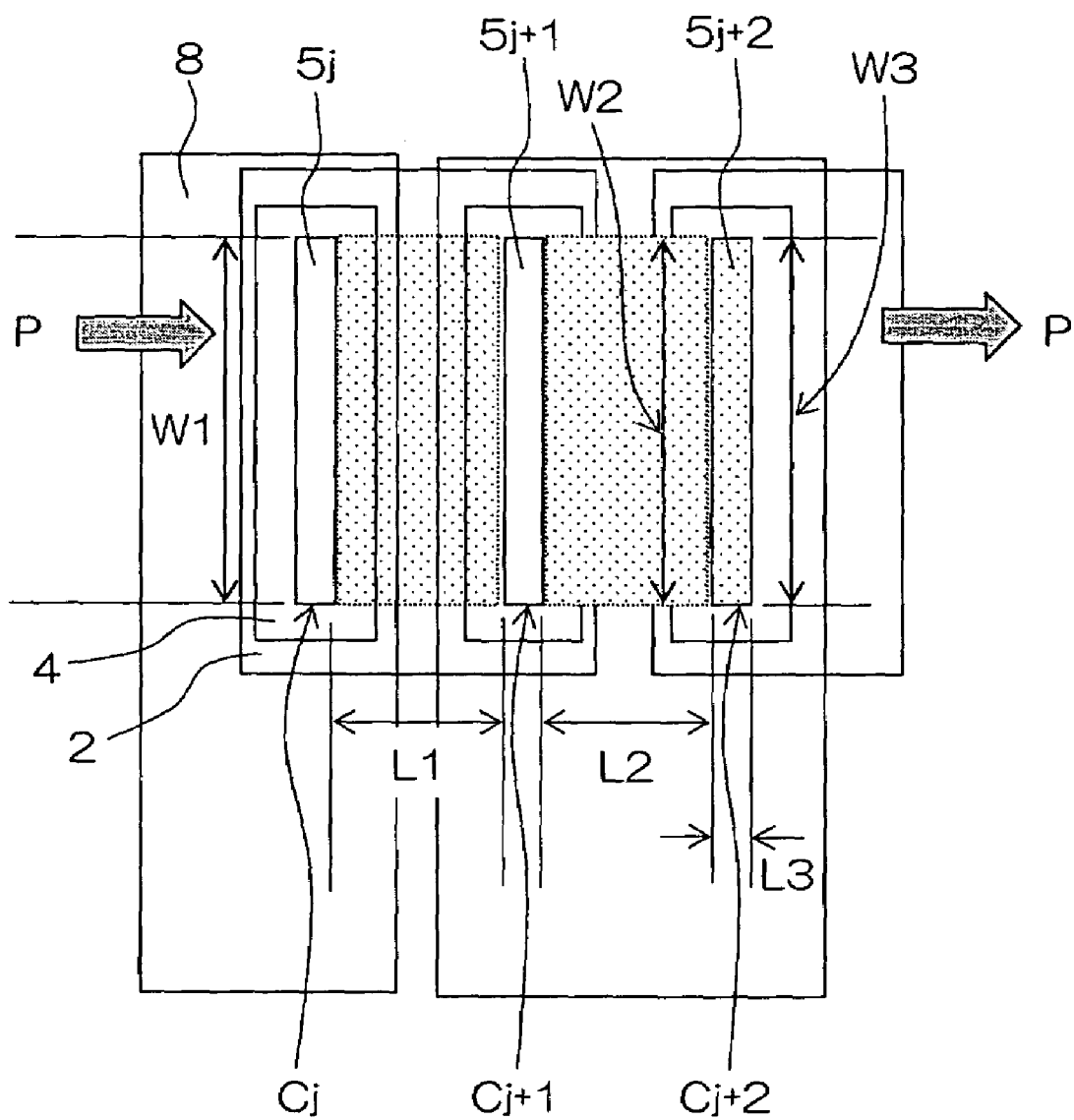
FIG. 4 is an enlarged view of an essential part of FIG. 1.
Figure 5:
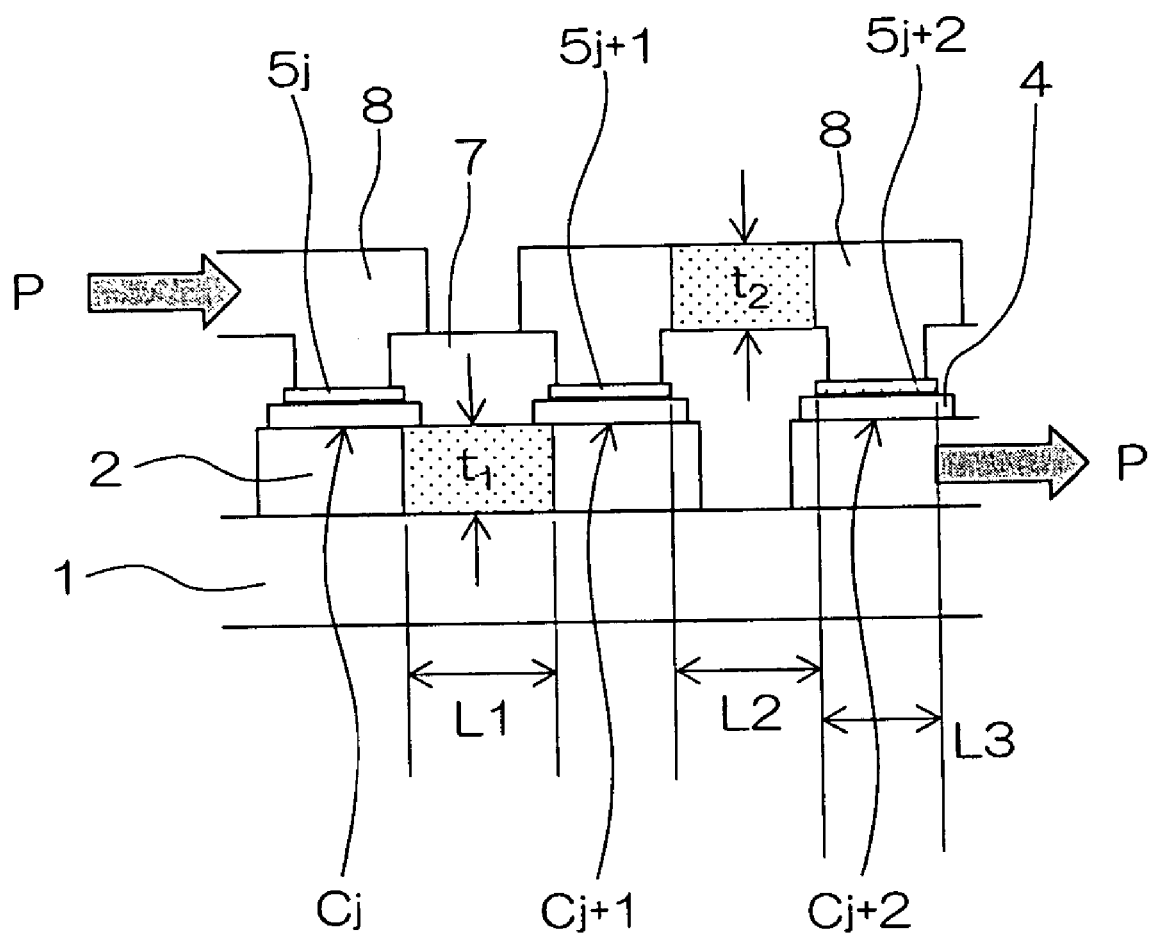
FIG. 5 is an enlarged view of an essential part of FIG. 3.

As shown in FIGS. 4 and 5, at areas where the lower electrodes 2 and upper electrodes 5 overlap in plan view, let the distance from an edge on the output terminal side of the upper electrode 5j (j=1 to 6) to an edge on the input terminal side of the upper electrode (5j+1) be represented by L1. Usually, the distance L1 varies and may take a different value when the number j is different. In other words, the distance L1 has a distribution with the number j as a parameter. Hereinafter, in this distribution, the maximum of distance L1 is referred to as "maximum distance L1" or simply as "distance L1".

At an area where the extraction electrodes 8 and the upper electrodes 5 overlap in plan view, let the minimum length in the direction perpendicular to the high frequency signal propagation direction P be represented by W1. Since usually the extraction electrodes 8 cover the entire upper electrodes 5, the minimum length corresponds to the length of the upper electrodes 5 in the direction perpendicular to the high frequency signal propagation direction P. Usually, the minimum length W1 also varies and may take a different value when the number j is different. In other words, the minimum length W1 has a distribution with the number j as a parameter. Hereinafter, in this distribution, the maximum of length W1 is referred to as "maximum length W1" or simply as "length W1".

In the present invention, electrical resistance of the variable-capacitance thin film capacitor is reduced by making the maximum distance L1 shorter than the minimum length W1. Meanwhile, the above mentioned limitations that "an area where the lower electrodes 2 and the upper electrodes 5 overlap in plan view" and that "an area where the extraction electrodes 8 and the upper electrodes 5 overlap in plan view" are intended to eliminate areas of the electrodes that substantially contribute little to generation of capacitance and areas that do not contribute to electrical conduction.

The thin film dielectric layer 4 is preferably a dielectric layer having a high dielectric constant, which comprises perovskite-type oxide crystal grains including at least Ba, Sr and Ti. However, the thin film dielectric layer 4 may comprise a material with high dielectric constant other than those listed above. The thin film dielectric layer 4 is formed on the surface of the lower electrode layer 2. A method for forming the thin film dielectric layer 4 is, for example, sputtering using a dielectric from which perovskite type oxide crystal grains can be obtained as the target. The sputtering is carried out for a length of time necessary for obtaining the desired thickness. By the sputtering at a high temperature, for example, 800° C., a thin film dielectric layer 4 with a high dielectric constant, high capacitance change, and minimal loss can be obtained without a heat treatment after the sputtering.

While the material for the upper electrode layer 5 is preferably Au having a small resistivity for reducing the resistance of the electrode, in order to enhance the adhesion to the thin film dielectric layer 4, a material such as Pt is preferably interposed between the thin film dielectric layer 4 and the upper electrode layer 5 as an adhesive layer. The thickness of the upper electrode layer 5 is specified as 0.1–10 μm. The lower limit of the thickness is determined taking the resistance of the electrode itself into consideration as in the case of the lower electrode layer 2. The upper limit of the thickness is determined taking adhesion to the thin film dielectric layer 4 into consideration.

Additionally, as shown in FIGS. 4 and 5, let the maximum length between an edge on the input terminal side and an edge on the output terminal side of any of the upper electrodes 5 be represented by L3. Usually, the maximum length L3 also varies and may take a different value when the number j is different. In other words, the maximum length L3 has a distribution with the number j as a parameter. Hereinafter, in this distribution, the maximum of length L3 is referred to as "maximum length L3" or simply as "length L3".

At an area where the extraction electrodes 8 and the upper electrodes 5 overlap in plan view, let the minimum length in the direction perpendicular to the high frequency signal propagation direction P be represented by W3. Since usually the extraction electrodes 8 cover the entire upper electrodes 5, the minimum length W3 corresponds to the length of the upper electrode 5 (shown as 5j+2, j is 1 to 5 in this case) in the direction perpendicular to the high frequency signal propagation direction P. Usually, the minimum length W3 also varies and may take a different value when the number j is different. In other words, the minimum length W3 has a distribution with the number j as a parameter. Hereinafter, in this distribution, the maximum of length W3 is referred to as "maximum length W3" or simply as "length W3". By designing the maximum length L3 to be shorter than the minimum length W3, the chip size of the variable-capacitance thin film capacitor can be reduced.

Meanwhile, as shown in FIG. 2, bias lines 31, 32 for applying DC bias voltage to the variable-capacitance elements C1–C7 are provided on the input terminal side and output terminal side, respectively.

The input terminal side bias line 31 comprises a conductor line extending from the input terminal 11 that is the input terminal edge of the variable-capacitance element C1. The input terminal side bias line 31 is connected through a thin film resistor 61 to a connection point between the variable-capacitance element C2 and variable-capacitance element C3, that is, to the extraction electrode 8 connecting the upper electrode 5 of the variable-capacitance element C2 with the upper electrode 5 of the variable-capacitance element C3. Similarly, the input terminal side bias line 31 is connected through a thin film resistor 62 to a connection point between the variable capacitor element C4 and variable-capacitance element C5 and the input terminal side bias line 31 is connected through a thin film resistor 63 to a connection point between the variable-capacitance element C6 and variable-capacitance element C7.

The output terminal side bias line 32 is connected through an additional conductor line 33 and a thin film resistor 64 to a connection point between the variable-capacitance element C1 and variable-capacitance element C2, that is, to the lower electrode 2 shared by the variable-capacitance element C1 and variable-capacitance element C2. Similarly, the output terminal side bias line 32 is connected through an additional conductor line 34 and a thin film resistor 65 to a connection point between the variable-capacitance element C3 and variable-capacitance element C4. Also, the output terminal side bias line 32 is connected through an additional conductor line 35 and a thin film resistor 66 to a connection point between the variable capacitor element C5 and variable-capacitance element C6.

Figure 6:
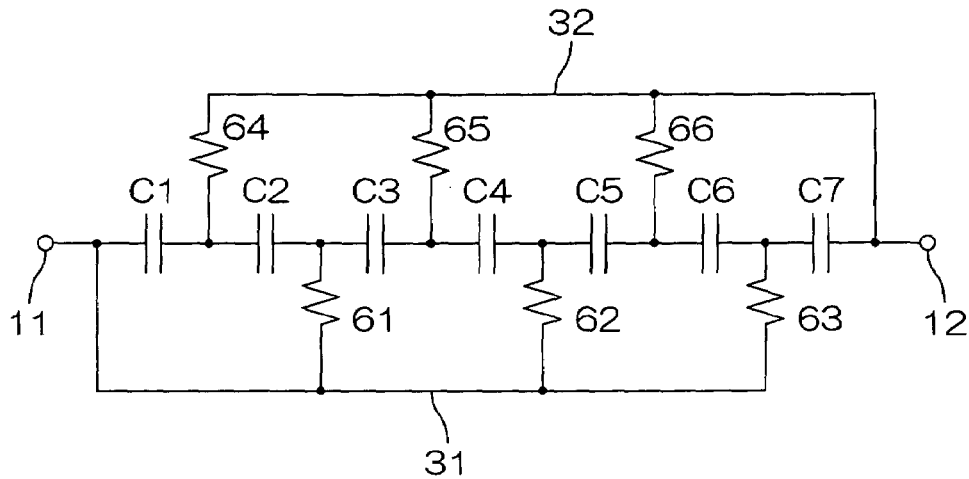
FIG. 6 is a circuit diagram of a variable-capacitance type thin film capacitor according to the present invention.

A circuit diagram of a variable-capacitance thin film capacitor comprising the above-described variable-capacitance elements C1–C7, bias lines 31, 32 and thin film resistors 61–66 is shown in FIG. 6. As the circuit construction shows, variable-capacitance elements C1–C7 whose capacitance changes depending on the voltage applied thereto are successively connected in series between the input terminal 11 and the output terminal 12. Thin film resistors 61–63 are provided between the input terminal 11 and connection points between the nth (n=even number) variable-capacitance elements and the (n+1)th variable-capacitance elements immediately posterior to the nth variable-capacitance elements, respectively, (with respect to the input terminal 11). Thin film resistors 64–66 are provided between the output terminal and connection points between the nth variable-capacitance elements and the (n+1)th variable-capacitance elements immediately anterior to the nth variable-capacitance elements, respectively (with respect to the output terminal 12). In the circuit of FIG. 6, for convenience of drawings, the additional conductor lines 33, 34, 35 are omitted.

Figure 7:
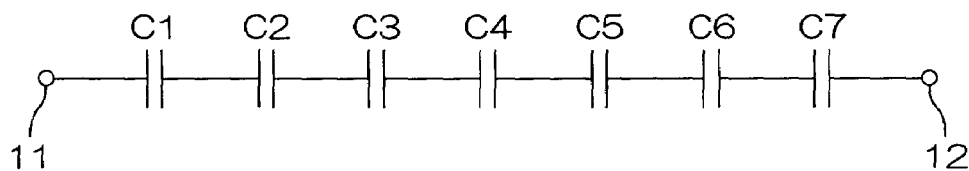
FIG. 7 is an equivalent circuit diagram of a variable-capacitance type thin film capacitor at a high frequency range.

When the variable-capacitance thin film capacitor of the present invention is used at a high frequency range, as the impedance of the variable-capacitance elements is adequately lower than the impedance of the thin film resistors, the thin film resistors can be assumed to be almost open. An equivalent circuit of the variable-capacitance thin film capacitor is a circuit with the variable-capacitance elements C1–C7 connected in series as shown in FIG. 7.

Figure 8:
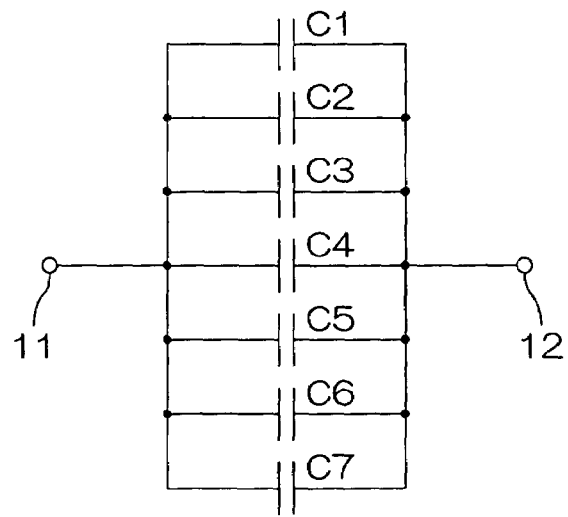
FIG. 8 is an equivalent circuit diagram of a variable-capacitance type thin film capacitor at a low frequency range including DC.

When the variable-capacitance thin film capacitor of the present invention is used at a low frequency range, as the impedance of the variable capacitor elements C1–C7 is adequately higher than the impedance of the thin film resistors, the thin film resistors can be assumed to be almost short. An equivalent circuit of the variable-capacitance thin film capacitor is a circuit with the variable-capacitance elements C1–C7 connected in parallel as shown in FIG. 8.

The input terminal side bias line 31, output terminal side bias line 32, and additional conductor lines 33, 34, 35 can be formed by another film deposition after the deposition of the lower electrode layer 2, thin film dielectric layer 4 and upper electrode layer 5. For the formation of these lines, the lift off process is preferably used in order to prevent the formation and machining of the conductor lines 31–35 from affecting the lower electrode layer 2, thin film dielectric layer 4 and upper electrode layer 5 that have already been formed and machined. Alternatively, the lower electrode layer 2 may be patterned into a geometry including the conductor lines 31–35 when the patterning of the lower electrode layer 2 is carried out. This can prevent increase in number of processes and shorten the time required for the deposition and machining of the conductor lines 31–35.

The material for the conductor lines 31–35 is preferably Au because of its low resistance so that difference in resistance among the bias lines is minimized. Pt can also be used.

The material for the thin film resistors 61–66 is preferably a material containing tantalum. The resistivity thereof is preferably $10^{-3}$ Ωcm or more. This is because with a resistivity as high as this level, it is possible to form thin film resistors with a small size that can be realized without increasing the size of the device.

Specific materials for the thin film resistors 61–66 may be tantalum nitride, TaSiN, and Ta—Si—O based materials. Because of its high enough resistivity.

For example, when tantalum nitride is used, a film with desired composition and resistivity can be produced by reactive sputtering in which sputtering is performed with Ta as the target in the presence of nitrogen. It is convenient that a film with a thickness of 40 nm or more and a resistivity of $10^{-3}$ Ωcm or more can be produced by selecting the sputtering conditions properly. After the sputtering, its patterning can be readily performed by etching such as reactive ion etching (RIE) after application of photoresist and patterning thereof into a predetermined shape.

Now, an explanation will be given referring to specific values. Assume that a variable-capacitance thin film capacitor according to the present invention is used at a frequency of 2 GHz. Given the capacitance of each of the variable-capacitance elements C1–C7 as 7 pF, in order to assume that they are connected in series as shown in FIG. 7 at a high frequency range (1 MHz or more) or higher and connected in parallel as shown in FIG. 8 at a low frequency range (from DC to 1 MHz), the resistance of each of the thin film resistors 61–66 may be about 1 kΩ or more.

For example, when the resistivity of the material of the thin film resistors 61–66 is $10^{-3}$ Ωcm and the thickness is 50 nm, in order to obtain a resistance of 10 kΩ for each of the thin film resistors, the aspect ratio (length/width) of the thin film resistors may be 50 or less. This is an achievable aspect ratio. Accordingly, it is easy to produce a thin film resistor with a desired resistance without increasing the size of the device.

These thin film resistors 61–66, input terminal side bias line 31, output terminal side bias line 32 and additional conductor lines 33–35 are formed directly on the supporting substrate 1. Therefore, it is no longer necessary to form an insulation layer for securing insulation among the lower electrode 2, upper electrode 5 and extraction electrode 8, which is otherwise required when they are formed on the chip. This reduces the layers constituting the device, eliminates the process of producing the insulation layer, and consequently, simplifies the whole production process.

Meanwhile, the insulation layer 7 is necessary for providing insulation between the extraction electrode layer 8 formed thereon and the lower electrode layer 2. In addition, this insulation layer 7 covers the individual bias lines and thin film resistors so that the individual bias lines and thin film resistors can be prevented from being oxidized as far as possible. For this reason, resistance of the individual bias lines and thin film resistors can be maintained to be almost constant over time, so that reliability of the device is improved. The material for the insulation layer 7 should comprise at least one kind selected from silicon nitride and silicon oxide for improving moisture resistance. It is preferably deposited by the CVD method or the like for good coatability.

The insulator layer 7 can be formed into the desired shape by usual dry etching with use of photoresist. However, in order to secure the bonding between the thin film resistors 61–66 and the extraction electrode 8, it is necessary to expose a part of the input terminal side bias line 31, output terminal side bias line 32 and additional conductor lines 33–35 and to expose the solder terminal portions on the upper electrodes 5.

The extraction electrodes 8 are provided for connecting the individual upper electrodes 5 to each other so as to connect in series the variable-capacitance element C1 to variable-capacitance element C2, the variable-capacitance element C3 to variable-capacitance element C4, and the variable-capacitance element C5 to variable-capacitance element C6, respectively.

Each of the extraction electrodes 8 are connected to each of the additional conductor lines 33–35 at areas outside the insulation layer 7. The material for the extraction electrodes 8 is preferably a metal with low resistance such as Au or Cu. Taking the adhesion between the extraction electrodes 8 and the insulation layer 7, an adhesive layer comprising Ti, Ni or the like may be interposed between the insulation layer and the extraction electrodes 8.

As FIGS. 4 and 5 show, let the distance (maximum interval) between an edge on the output terminal side of the upper electrode 5j+1 and an edge on the input terminal side of the upper electrode 5j+2 at an area where the upper electrode 5 overlap the extraction electrode 8 in plan view be represented by L2. Usually, the distance L2 varies and may take a different value when the number j is different. In other words, the distance L2 has a distribution with the number j as a parameter. Hereinafter, in this distribution, the maximum of distance L2 is referred to as "maximum distance L2" or simply as "distance L2". In addition, let W2 be the minimum length in the direction perpendicular to the high frequency signal propagation direction at an area where the extraction electrodes 8 overlap the upper electrodes 5 in plan view. Since usually the extraction electrodes 8 cover the entie upper electrodes 5, the minimum length W2 is a length of the upper electrodes 5 in the direction perpendicular to the high frequency signal propagation direction. The length W2 also usually varies and may take a different value when the number j is different. In other words, the length W2 has a distribution with the number j as a parameter. Hereinafter, in this distribution, the minimum of length W2 is referred to as "minimum length W2" or simply as "length W2".

By designing the device so that the maximum distance L2 is shorter than the minimum length W2, the electrode resistance of the extraction electrodes 8 can be reduced.

The minimum lengths W1, W2 and W3 described above are minimum lengths in the direction perpendicular to the high frequency signal propagation direction at areas where the extraction electrodes 8 overlap the upper electrodes 5. Both are defined by the same wording. Accordingly, W1=W2=W3 is satisfied.

Then, a protective layer 9 is formed by photolithography. The protective layer 9 is capable of mechanically and chemically protecting the individual variable-capacitance elements C1–C7 from the outside and contamination by chemicals. The protective layer 9 is formed so that the solder terminal portions 111 and 112 are exposed. Materials with high thermal resistance and good gap filling performance are preferred for the protective layer 9, namely, polyimide, BCB (benzocyclobutene) resin, etc.

The solder diffusion barrier layer 10 is formed by sputtering so as to prevent the solder from diffusing into the electrodes due to reflow during the solder formation or during the mounting. A suitable material for this layer is Ni because of its slow reaction speed to the solder. Additionally, in order to improve solder wettability, a Au or Cu layer with high solder wettability may be formed to a thickness of about 0.1 μm.

Finally, the solder terminal portions 111, 112 are formed. Generally, these are formed by reflow after printing solder paste.

In the variable-capacitance thin film capacitor described so far as an embodiment, by connecting the individual variable-capacitance elements C1–C7 by means of bias lines having a resistance mainly determined by the thin film resistors 61–66, the variable-capacitance elements C1–C7 are connected in series at a high frequency range as shown in FIG. 7, and connected in parallel at a low frequency range including direct current as shown in FIG. 8.

By the use of the thin film resistors 61–66 that contains tantalum nitride and has a resistivity of $10^{-3}$ Ω or more, the aspect ratio of the thin film resistors 61–66 is reduced, thereby achieving miniaturization of the device. Furthermore, by forming the input terminal side bias line 31, output terminal side bias line 32 and additional conductor lines directly on the supporting substrate 1, reduction of the number of layers constituting the device is achieved.

The variable-capacitance thin film capacitor described above is used as a part of a resonant circuit (capacitance component of a LC resonant circuit) of a high frequency component, or as a capacitance combining element for combining the resonant circuits. In addition, by simultaneously forming an inductor utilizing the lower electrode layer 2, upper electrode layer 5 or extraction electrode layer 8 of the variable-capacitance thin film capacitor device, or forming another resonant circuit in a margin area (where there is no variable-capacitance thin film capacitor formed) of the supporting substrate 1, the variable-capacitance thin film capacitor can be used as a component of a voltage controlled high frequency resonant circuit. In addition, the variable-capacitance thin film capacitor can be used for a voltage controlled high frequency filters which are composite devices combining the resonant circuits, and other high frequency devices including voltage controlled matching circuit chips, voltage controlled antenna duplexers and the like.

As discussed so far, according to the variable-capacitance thin film capacitor of the present invention, in a series-connected variable-capacitance thin film capacitor, the maximum distance L1 between an edge on the output side of the upper electrode 5j and an edge on the input side of the upper electrode 5j+1 at an area where the upper electrodes 5 overlap the lower electrodes 2 is determined to be smaller than the minimum length W1 in the direction perpendicular to the high frequency signal propagation direction P at an area where the upper electrodes 5 overlap the extraction electrodes 8 in plan view. By this arrangement, it is possible to design the maximum distance L1 to be short, thereby reducing the electrical resistance. As a result, a variable-capacitance thin film capacitor with great Q-value, and electronic components using the capacitor can be provided.

In addition, the maximum distance L2 between an edge on the output side of the upper electrode 5j+1 and an edge on the input side of the upper electrode 5j+2 at an area where the upper electrodes 5 overlap the extraction electrodes 8 in plan view is determined to be shorter than the minimum length W2 in the direction perpendicular to the high frequency signal propagation direction P at an area where the upper electrodes 5 overlap the extraction electrodes 8 in plan view. By this arrangement, it is possible to design the length of the extraction electrodes 8 to be small, thereby reducing the electrical resistance. As a result, a variable-capacitance thin film capacitor with great Q-value and electronic components using the capacitor can be provided.

Furthermore, the maximum length L3 between an edge on the input side of any of the upper electrodes 5 and an edge on the output side thereof is determined to be shorter than the minimum length W3 in the direction perpendicular to the high frequency signal propagation direction in plan view. By this arrangement, it is possible to design the distance between the input terminal 11 and the output terminal 12 to be small. As a result, the size of the variable-capacitance thin film capacitor can be reduced, so that a miniaturized variable-capacitance thin film capacitor and electronic components using the capacitor can be produced.

When the thin film dielectric layer 4 is formed using $(Ba_xSr_{1-x})_yTi_{1-y}O_{3-x}$, a variable-capacitance capacitor with variable-capacitance elements having great capacitance change and minimal loss can be produced.

In addition, the input terminal 11 serves both as the input terminal for high frequency signals and the terminal for supplying DC bias voltages, which simplifies the construction of the device.

In addition, a variable-capacitance thin film capacitor of the present invention includes a protective layer 9 which covers at least the bias lines and comprises at least one kind selected from the group consisting of silicon nitride and silicon oxide. Since this can prevent the bias lines and thin film resistors from being oxidized, it is possible to maintain the resistances of the bias lines and thin film resistors to be constant over time. Moreover, moisture resistance can also be ensured, so that a variable-capacitance thin film capacitor with improved reliability and electronic components using the capacitor can be provided.

Furthermore, by using the variable-capacitance thin film capacitor as a part of resonant circuits of a voltage controlled high frequency resonator, or as a means for combining resonant circuits together, resonators can be produced. As a result, a voltage controlled high frequency resonator with excellent power handling capability and minimal waveform distortion and noises due to intermodulation distortion can be provided. Similarly, in the cases of voltage controlled high frequency filters and voltage controlled antenna duplexers having resonant circuits, by using the variable-capacitance thin film capacitor connected in series for a high frequency range and in parallel for DC, voltage controlled high frequency filters and voltage controlled antenna duplexers with excellent power handling capability and minimal waveform distortion and noises due to intermodulation distortion can be produced.

Figure 12:
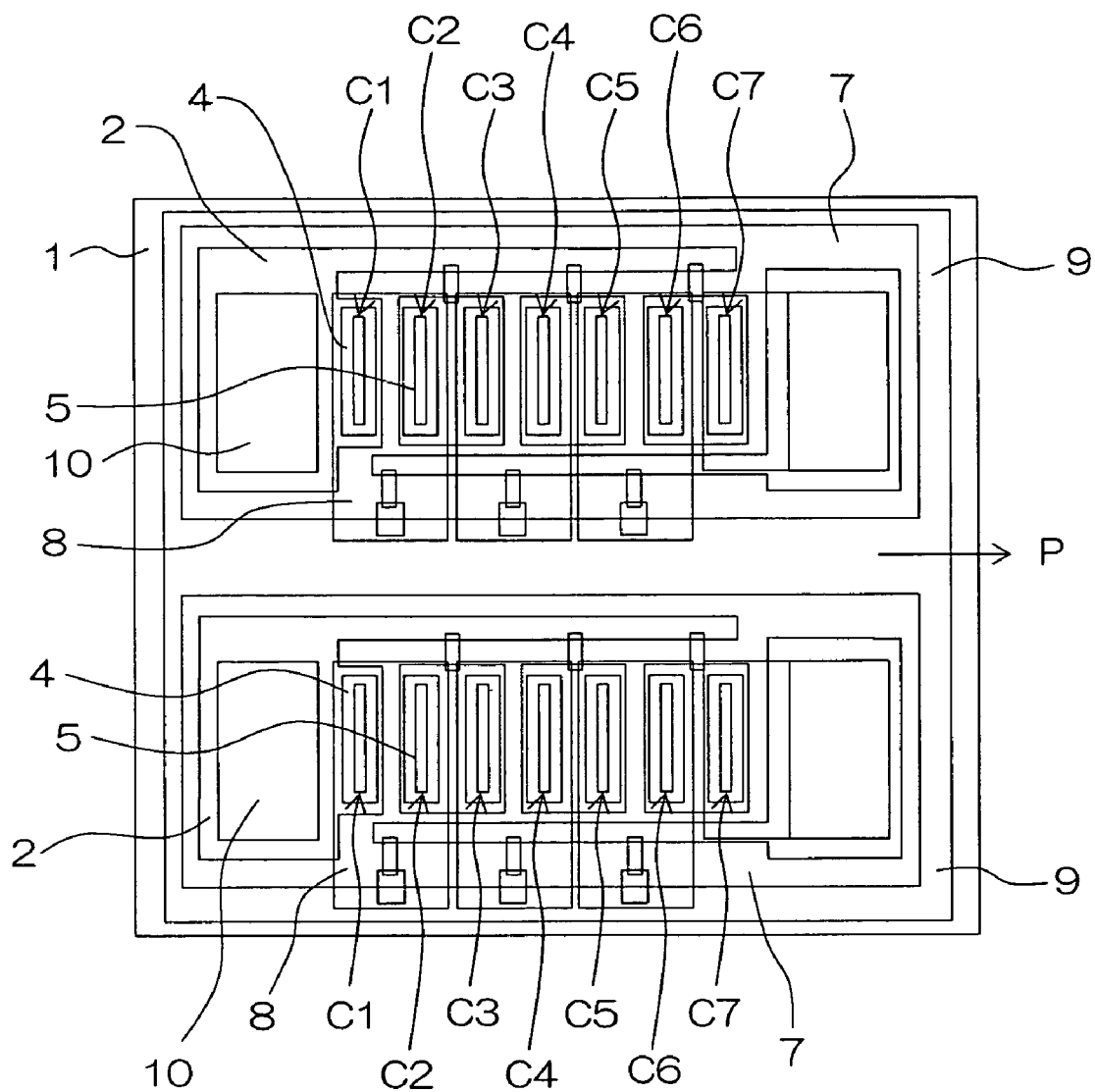
FIG. 12 is a perspective plan view of an embodiment of a thin film capacitor array according to the present invention.

As shown in FIG. 12, the above described variable-capacitance thin film capacitor can be arranged to constitute a thin film capacitor array such that a plurality of rows of the thin film capacitors are arranged in parallel in the direction perpendicular to the high frequency signal propagation direction in plan view. In addition, as shown in FIG. 13, the plurality of thin film capacitors may share the lower electrodes 2 and extraction electrodes 8.

Figure 13:
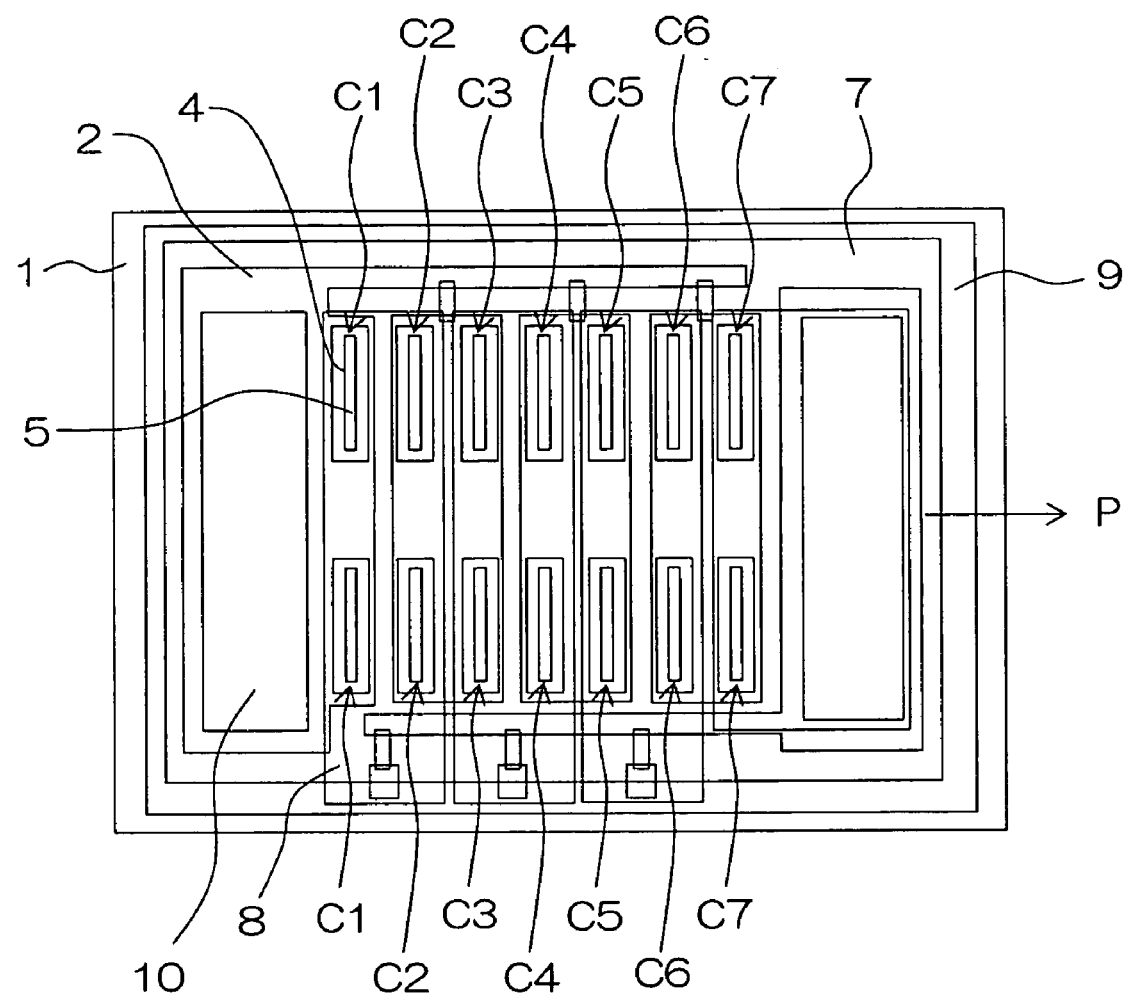
FIG. 13 is a perspective plan view of another embodiment of a thin film capacitor array according to the present invention.

In the thin film capacitor arrays shown in FIGS. 12 and 13, the distance between the upper electrodes 5 in the direction perpendicular to the high frequency signal propagation direction is preferably at least 50 μm and at most 250 μm. This is because if the distance is less than 50 μm, in any of the lower electrodes 2 and the extraction electrodes 8, electric current flows concentratedly between two adjacent capacitance generation sections arranged in the high frequency signal propagation direction P, resulting in an increase of the electrode resistance and reduction of Q-value. On the other hand, if the distance is greater than 250 μm, the electrode resistance increases and the chip size of the thin film capacitor array is bound to be enlarged. In addition, the distance between an end portion of the lower electrode 2 and an end portion of the upper electrode 5 closest thereto in the direction perpendicular to the high frequency signal propagation direction P in plan view is preferably smaller than 50 μm. This is because in any of the lower electrodes 2 and extraction electrodes 8, there is a current path flowing through end portions of the lower electrodes 2 and the extraction electrodes 8 as a part of current path flowing through two adjacent capacitance generation sections arranged in the high frequency signal propagation direction P, and if the distance between the end portion of the lower electrode 2 and the end portion of the upper electrode 5 closest thereto in the direction perpendicular to the high frequency signal propagation direction P in plan view is longer than 50 μm, the current path lengthens, resulting in an increased surface electrode resistance and reduced Q-value.

As described above, by connecting a plurality of rows of the thin film capacitors in the direction perpendicular to the high frequency signal propagation direction P in plan view, the resistance value of the electrodes can be reduced so as to increase the capacitance value, so that a thin film capacitor array with a high Q-value can be obtained. In particular, in the thin film capacitor array shown in FIG. 13, the lower electrodes 2 and the extraction electrodes 8 are shared among the plurality of rows of the thin film capacitors, which enables further miniaturization of the array. Furthermore, since the lower electrodes 2 and the extraction electrodes 8 are shared, concentration of electric current can be mitigated, so that obtaining a thin film capacitor array with further reduced resistance can be expected.

EXAMPLE

An example will be given for describing the present invention more specifically.

First, a sapphire R substrate was used as the supporting substrate 1. Pt was used as the material for the lower electrodes 2 and deposited on the supporting substrate 1 by sputtering at a substrate temperature of about 500° C. Before initiating the deposition of the thin film dielectrics 4, annealing for flattening the lower electrodes 2 formed of Pt was carried out by keeping the sample at about 800° C. The deposition of the thin film dielectrics 4 was carried out using $(Ba_{0.5}Sr_{0.5})TiO_3$ as the target at a substrate temperature of about 800° C. for 15 minutes. The upper electrodes 5 each consisting of two layers including a Pt electrode layer as the lower layer and a Au electrode layer as the upper layer were deposited on the thin film dielectrics 4. The above described deposition processes were successively carried out within the same chamber without exposing to the atmospheric air.

Then, after a photoresist was applied to form a photoresist layer by a photolithography technique and it was patterned into the predetermined shape, the upper electrodes 5 were etched into a predetermined shape with an ECR (Electron Cyclotron Resonance) apparatus. Thereafter, the thin film dielectrics 4 and lower electrodes 2 were etched into predetermined patterns in the same way. The pattern of the lower electrodes 2 included the conductor lines 31–35.

Subsequently, tantalum nitride was used to form the thin film resistors 61–66, and it was deposited by sputtering at about 100° C. After the sputtering, a photoresist layer was patterned into the predetermined shape by a photolithography technique, and then the photoresist layer was removed by etching with use of an RIE apparatus. All of the thin film resistors 61–66 were designed to have an aspect ratio of 20.

Then, a $SiO_2$ film was deposited as the insulation layer 7 by means of a CVD apparatus with TEOS (tetra-ethoxy-silane) as the material gas. After a photoresit layer was processed, it was etched into the predetermined pattern with an RIE apparatus.

Subsequently, as the extraction electrodes 8, Ni and Au were successively deposited by sputtering, and patterned into a predetermined shape.

Finally, the protective layer 9, solder diffusion barrier layer 10, and solder terminals 111 and 112 were successively deposited in this order. A polyimide resin was used for the protective layer 9, and Ni was used for the solder diffusion barrier layer 10.

Here, the maximum distance L1 between an edge on the output side of the upper electrode 5j and an edge on the input side of the upper electrode 5j+1 at the lower electrode 2 was 40 μm. The minimum length W1 in the direction perpendicular to the high frequency signal propagation direction P in plan view at an area where the extraction electrodes 8 and upper electrodes 5 overlap in plan view was 50 μm. The maximum distance L2 between an edge on the output side of the upper electrode 5j+1 and an edge on the input side of the upper electrode 5j+2 at the extraction electrode 8 was 40 μm. The minimum length W2 in the direction perpendicular to the high frequency signal propagation direction P in plan view at an area where the extraction electrodes 8 and upper electrodes 5 overlap in plan view was 50 μm. The distance L3 between an edge on the input side of one of the upper electrodes 5 and an edge on the output side of the same was 10 μm, and the minimum length W3 in the direction perpendicular to the high frequency signal propagation direction P in plan view was 50 μm.

Figure 9:
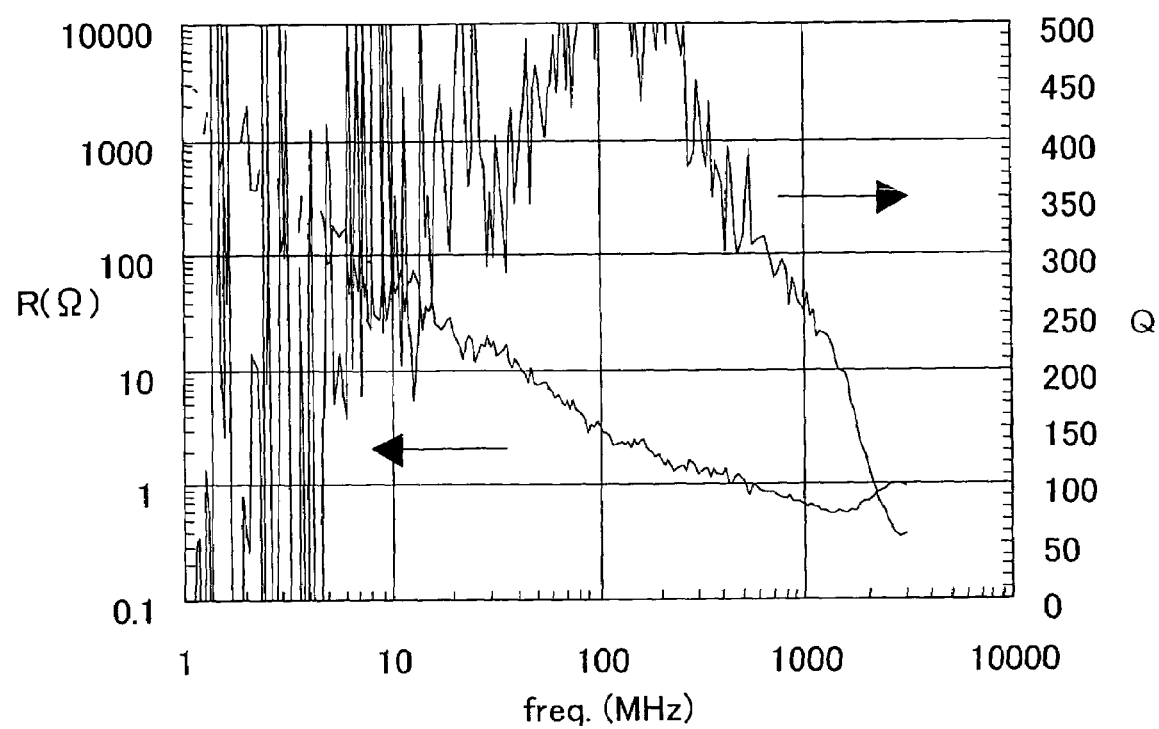
FIG. 9 shows frequency characteristics of resistance and Q-value of a thin film capacitor according to the present invention.

The variable-capacitance thin film capacitor obtained through the steps above was measured by an impedance analyzer (Agilent Technologies Model No.HP4991A), a result of which is shown in FIG. 9.

In FIG. 9, the horizontal axis represents frequency and the vertical axis represents resistance and Q-value. The electrode resistance was 0.73 Ω, and Q-value was 113 at a measurement frequency of 2 GHz. The chip size was 1.0 mm×0.5 mm in plan view.

Figure 10:
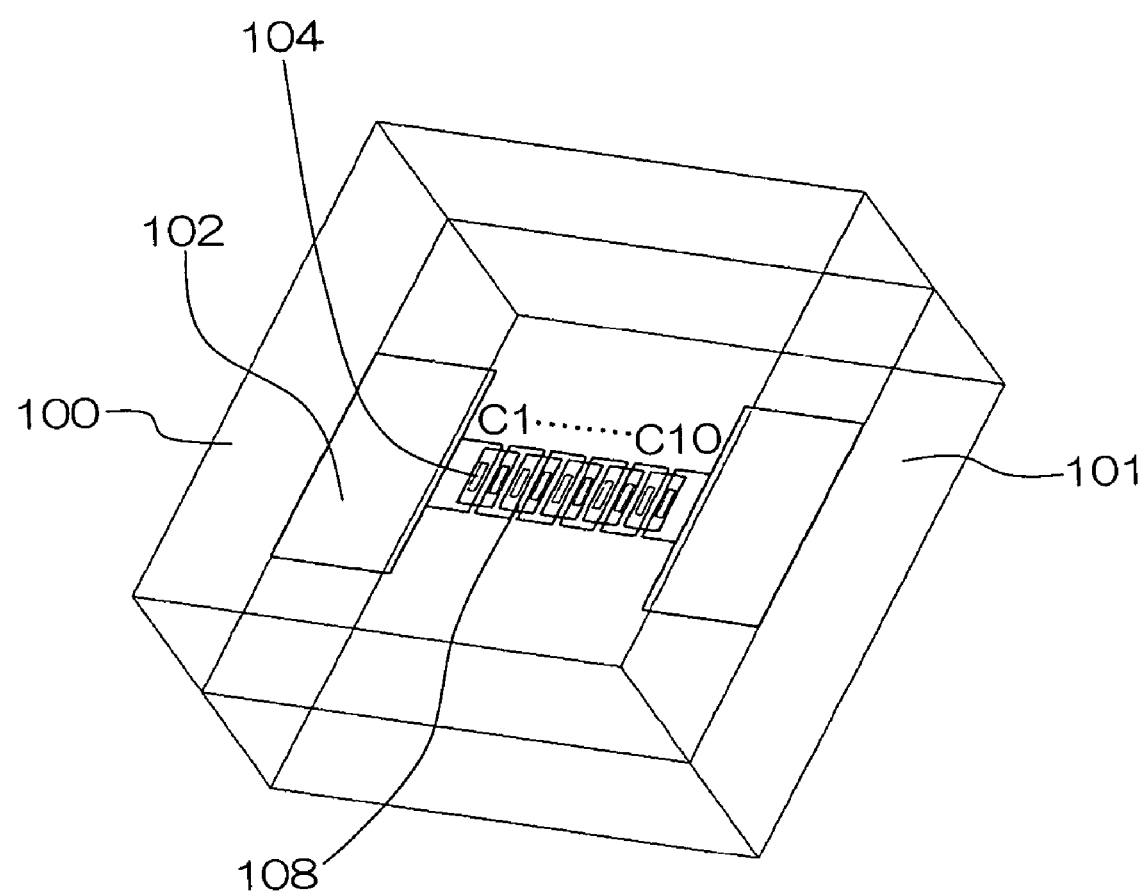
FIG. 10 shows a simulation model of a thin film capacitor according to the present invention.
Figure 11:
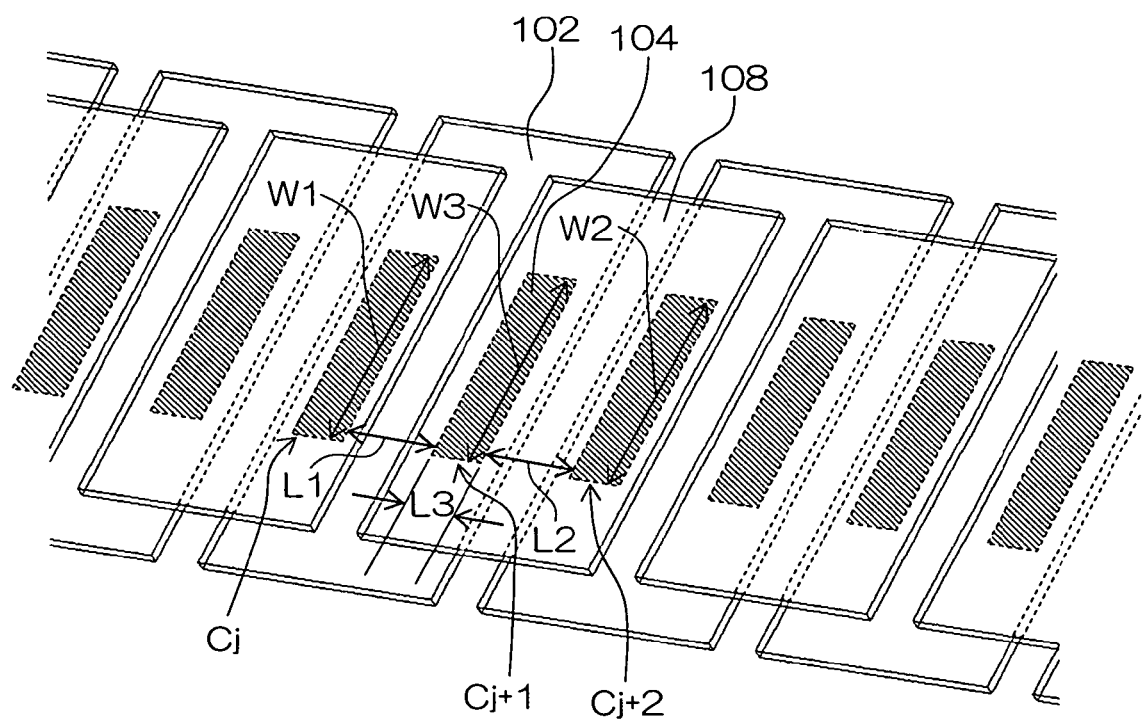
FIG. 11 is an enlarged view of an essential part of FIG. 10.

Then, a simulation was carried out using an electromagnetic field simulator HFSS (High-Frequency Structure Simulator: An soft corporation Ver8.5), the result of which is shown. FIG. 10 shows a model based on a design of the present invention, and FIG. 11 shows an enlarged view thereof. Lower electrodes 102 were disposed on a supporting substrate 101, on which thin film dielectrics 104, extraction electrodes 108 (serving also as upper electrodes), and an air layer 100 were disposed. The air layer 100 was disposed and instead, thin film resistors, protective layer, solder diffusion barrier layer and solder terminals were omitted here. This is intended to simplify the protective layer simulation model.

Table 1 shows the designed values of the models used for the simulation and measurement results. Here, sample No. 1 is a model with L1=20 μm, W1=40 μm, L2=20 μm, and W2=40 μm. Sample No. 2 is a model where L1 is varied to 60 μm. Sample No.3 is a model where modification was made as L1=20 μm and L2=60 μm.

TABLE 1

| No. | L1 (μm) | W1 (μm) | L2 (μm) | W2 (μm) | R (Ω) | Q |
|---|---|---|---|---|---|---|
| 1 | 20 | 40 | 20 | 40 | 0.42 | 184 |
| 2* | 60 | 40 | 20 | 40 | 0.55 | 142 |
| 3* | 20 | 40 | 60 | 40 | 0.51 | 155 |

*Comparative example

The frequency used in the calculations was 2 GHz. The results of comparison on resistance R and Q-value based on the calculation results are shown in Table 1. In sample No.2 where L1>W1, resistance R is increased by 0.12 Ω and Q is decreased by 42 as compared to sample No. 1. When samples No.1 and No.3 are compared, in sample No. 3 where L2>W2, resistance R increased by 0.09 Ω and Q-value decreased by 29 as compared to sample No. 1.

Table 2 shows a relationship between L3, W3 and chip size. Sample No. 4 is a model where L3=10 μm, W3=50 μm. Sample No. 5 is a model where L3 is modified to 50 μm and W3 is modified to 10 μm.

Sample No. 5 where L3>W3 has a chip size (area ratio) as large as 1.3 that of sample No. 4. In other words, the chip size can be reduced when L3<W3 is satisfied.

TABLE 2

| No. | L3 (μm) | W3 (μm) | Chip size (μm²) | Area ratio |
|---|---|---|---|---|
| 4 | 10 | 50 | 1.00 × 0.50 | 1 |
| 5* | 50 | 10 | 1.44 × 0.46 | 1.3 |

*Comparative example

In addition, a simulation was carried out by means of HFSS on a model where two capacitance generation sections were connected in parallel in the direction perpendicular to the high frequency signal propagation direction P in plan view and lower electrodes 2 were shared as shown in FIG. 13. The results show that, in the present invention, as a result of the upper electrodes 5 being spaced at intervals of 150 µm, the capacitance was 2.0 pF, electrode resistance was 0.44 Ω and Q-value was 89.

On the other hand, the model as the comparative example without parallel-connection had a capacitance of 1.0 pF, an electrode resistance of 0.93 Ω, and a Q-value of 90. In addition, when the size in plan view of the upper electrodes 5 of this model as the comparative example was doubled in the direction perpendicular to the high frequency signal propagation direction, the capacitance was 2.0 pF, the electrode resistance was 0.64 Ω and the Q-value was 54.

Thus, when the size of the upper electrodes 5 was doubled in the direction perpendicular to the high frequency signal propagation direction so as to increase the capacitance from 1.0 pF to 2.0 pF, the electrode resistance was 0.64 Ω and the Q-value decreased from 89 to 54. As a result of invention, electrode resistance was improved by 0.2 Ω, and Q-value increased by 35, which was about the same level as when the capacitance was 1.0 pF.

The simulation results and the actually fabricated examples of the present invention show that a variable-capacitance thin film capacitor in which electrode resistance is reduced, q-value is increased as well as chip size is reduced can be produced.

What is claimed is:

1. A thin film capacitor having capacitance elements connected between an input terminal and output terminal comprising:
    a supporting substrate;
    a plurality of lower electrodes spaced apart from each other provided on the supporting substrate;
    two upper electrodes formed on at least one of the lower electrodes through a thin film dielectric; and
    an extraction electrode for connecting each of the two upper electrodes,
    wherein a distance between the two upper electrodes formed on the lower electrode along a high frequency signal propagation direction is smaller than a length along the direction perpendicular to the high frequency signal propagation direction at an area where the upper electrodes and the extraction electrode overlap in plan view.

2. The thin film capacitor according to claim 1, wherein the capacitance thereof varies by application of a DC bias voltage between the input terminal and the output terminal.

3. The thin film capacitor according to claim 2, wherein an input terminal side bias line is connected between the input terminal and a connection point between the nth capacitance element and the (n+1)th capacitance element where n is an even number counted from the input terminal side, and
    an output terminal side bias line is connected between the output terminal and a connection point between the nth capacitance element and the (n+1)th capacitance element where n is an even number counted from the output terminal side.

4. A capacitor array comprising a plurality of rows of the thin film capacitor according to claim 1, which are connected in parallel between the input terminal and the output terminal.

5. The capacitor array according to claim 4, wherein the lower electrodes are shared among the plurality of rows of the thin film capacitor.

6. An electronic component comprising the thin film capacitor according to claim 1, which utilizes the thin film capacitor as a resonance element.

7. An electronic component comprising the thin film capacitor according to claim 1, which utilizes the thin film capacitor as an element for coupling a plurality of circuits.

8. A thin film capacitor having capacitance elements connected between an input terminal and an output terminal, comprising:
    a supporting substrate;
    a plurality of lower electrodes spaced apart from each other provided on the supporting substrate;
    upper electrodes formed on each of the lower electrodes adjacent to each other provided on the supporting substrate through a thin film dielectric; and
    an extraction electrode for connecting the upper electrodes formed on each of the lower electrodes that are adjacent to each other,
    wherein a distance between the upper electrodes formed on each of the adjacent lower electrodes along a high frequency signal propagation direction is smaller than a length along the direction perpendicular to the high frequency signal propagation direction at an area where the upper electrodes and the extraction electrode overlap in plan view.

9. The thin film capacitor according to claim 8 whose capacitance varies by application of a DC bias voltage between the input terminal and the output terminal.

10. The thin film capacitor according to claim 9, wherein an input terminal side bias line is connected between the input terminal and a connection point between the nth capacitance element and the (n+1)th capacitance element where n is an even number counted from the input terminal side, and
    an output terminal side bias line is connected between the output terminal and a connection point between the nth capacitance element and the (n+1)th capacitance element where n is an even number counted from the output terminal side.

11. A thin film capacitor array comprising a plurality of rows of the variable-capacitance thin film capacitor elements according to claim 8, which are connected in parallel between the input terminal and the output terminal.

12. The thin film capacitor array according to claim 11, wherein the lower electrodes are shared among the plurality of rows of the variable-capacitance elements.

13. An electronic component comprising the thin film capacitor according to claim 8, which utilizes the thin film capacitor as a resonance element.

14. An electronic component comprising the thin film capacitor according to claim 8, which utilizes the thin film capacitor as an element for coupling a plurality of circuits.

15. A thin film capacitor having capacitance elements connected between an input terminal and an output terminal, comprising:
    a supporting substrate;
    a plurality of lower electrodes spaced apart from each other that are provided on the supporting substrate;
    an upper electrode formed on at least one of the lower electrodes through a thin film dielectric; and
    an extraction electrode for connecting the upper electrodes,
    wherein a length of the upper electrodes along a high frequency signal propagation direction is smaller than a length along the direction perpendicular to the high frequency signal propagation direction at an area where the upper electrodes and the extraction electrode overlap in plan view.

16. The thin film capacitor according to claim 15 whose capacitance varies by application of a DC bias voltage between the input terminal and the output terminal.

17. The thin film capacitor according to claim 16, wherein an input terminal side bias line is connected between the input terminal and a connection point between the nth capacitance element and the (n+1)th capacitance element where n is an even number counted from the input terminal side, and
    an output terminal side bias line is connected between the output terminal and a connection point between the nth capacitance element and the (n+1)th capacitance element where n is an even number counted from the output terminal side.

18. A capacitor array comprising a plurality of rows of the thin film capacitors according to claim 15, which are connected in parallel between the input terminal and the output terminal.

19. The capacitor array according to claim 18, wherein the lower electrodes are shared among the plurality of rows of the thin film capacitors.

20. An electronic component comprising the thin film capacitor according to claim 15, which utilizes the thin film capacitor as a resonance element.

21. An electronic component comprising the thin film capacitor according to claim 15, which utilizes the thin film capacitor as an element for coupling a plurality of circuits.

* * * * *